United States Patent
Fedtke

(10) Patent No.: US 10,054,465 B2
(45) Date of Patent: Aug. 21, 2018

(54) METHOD AND SYSTEM FOR OPERATING A MOBILE DEVICE USING A MAGNETIC SENSOR

(71) Applicant: Stephen U. Fedtke, Zug (CH)

(72) Inventor: Stephen U. Fedtke, Zug (CH)

(*) Notice: Subject to any disclaimer, the term of this patent is extended or adjusted under 35 U.S.C. 154(b) by 206 days.

(21) Appl. No.: 15/049,856

(22) Filed: Feb. 22, 2016

(65) Prior Publication Data

US 2017/0241801 A1  Aug. 24, 2017

(51) Int. Cl.
| G08B 21/00 | (2006.01) |
| G01D 5/12  | (2006.01) |
| G01D 5/14  | (2006.01) |
| G01R 33/00 | (2006.01) |
| G08B 13/24 | (2006.01) |

(52) U.S. Cl.
CPC ............. *G01D 5/12* (2013.01); *G01D 5/145* (2013.01); *G01R 33/0029* (2013.01); *G08B 13/2402* (2013.01); *G08B 13/2474* (2013.01)

(58) Field of Classification Search
CPC ...... G01B 7/14; G08B 13/08; G08B 13/2474; G08B 13/06; E05B 85/26; G01D 5/145; G01D 5/2013; G01D 5/147
USPC ............. 340/686.6, 815.45, 572.1, 542, 551, 340/568.8, 573.2, 568.1; 342/655, 342/207.23, 251, 207.21; 324/655, 324/207.23, 251, 207.21, 207.24
See application file for complete search history.

(56) References Cited

U.S. PATENT DOCUMENTS

| 5,596,272 | A  | * | 1/1997  | Busch      | G01D 5/147 324/174      |
| 5,668,452 | A  | * | 9/1997  | Villarreal | B25J 19/027 318/568.1   |
| 6,984,994 | B2 | * | 1/2006  | Gregg      | G01D 5/2013 324/207.26  |
| 7,355,389 | B2 | * | 4/2008  | Rieger     | G01D 5/145 324/207.21   |
| 7,392,119 | B2 | * | 6/2008  | Allard     | B60C 23/0416 340/445    |
| 7,999,644 | B2 | * | 8/2011  | Nakayama   | H03K 17/9502 335/161    |
| 8,416,078 | B2 | * | 4/2013  | Sayegh     | G08B 13/248 340/568.1   |
| 9,835,472 | B2 | * | 12/2017 | Scherr     | G01D 5/145              |
| 2002/0171547 | A1 | * | 11/2002 | Johnston | G08B 13/06 340/568.1    |
| 2003/0179000 | A1 | * | 9/2003  | Gregg    | G01D 5/2013 324/655     |

(Continued)

*Primary Examiner* — Hoi Lau
(74) *Attorney, Agent, or Firm* — Womble Bond Dickinson (US) LLP

(57) ABSTRACT

According to one embodiment, a magnetic sensor attached to a mobile device detects a magnetic field generated from a magnet attached to an object. A magnetic sensor data processing module generates magnetic sensor data based on the magnetic field, where the magnetic sensor data represents a current position of the magnet of the object. An action processing module processes the magnetic sensor data to determine a movement of the object with respect to the mobile device, while the mobile device remains in a relatively steady location and identifies a predetermined action based on the movement of the object. The predetermined action is then performed within the mobile device.

20 Claims, 14 Drawing Sheets

(56) References Cited

U.S. PATENT DOCUMENTS

| | | | |
|---|---|---|---|
| 2004/0130315 A1* | 7/2004 | Lamb | E05B 85/26 |
| | | | 324/207.2 |
| 2004/0217832 A1* | 11/2004 | Lamb | E05B 85/26 |
| | | | 335/205 |
| 2007/0057786 A1* | 3/2007 | McClure | G01R 33/28 |
| | | | 340/551 |
| 2007/0096723 A1* | 5/2007 | Rieger | G01D 5/145 |
| | | | 324/207.24 |
| 2009/0018434 A1* | 1/2009 | Kimura | A61B 1/00158 |
| | | | 600/424 |
| 2009/0231132 A1* | 9/2009 | Shoenfeld | E05B 47/0012 |
| | | | 340/542 |
| 2009/0295376 A1* | 12/2009 | Vu | G01B 7/30 |
| | | | 324/207.23 |
| 2011/0304458 A1* | 12/2011 | Sayegh | G08B 13/2474 |
| | | | 340/568.8 |
| 2012/0044081 A1* | 2/2012 | Koppal | H04M 1/0235 |
| | | | 340/686.6 |
| 2013/0320941 A1* | 12/2013 | Contaldo | G01D 5/145 |
| | | | 323/273 |
| 2015/0338473 A1* | 11/2015 | Diaconu | G01R 33/0029 |
| | | | 324/251 |
| 2016/0008091 A1* | 1/2016 | Saotome | G06K 7/10366 |
| | | | 340/572.1 |
| 2016/0051164 A1* | 2/2016 | Derichs | A61B 5/05 |
| | | | 600/409 |
| 2016/0187118 A1* | 6/2016 | Modi | G01B 7/14 |
| | | | 340/815.45 |
| 2016/0298950 A1* | 10/2016 | Modi | G01B 7/14 |
| 2017/0089726 A1* | 3/2017 | Scherr | G01D 5/145 |
| 2017/0241801 A1* | 8/2017 | Fedtke | G01D 5/12 |

* cited by examiner

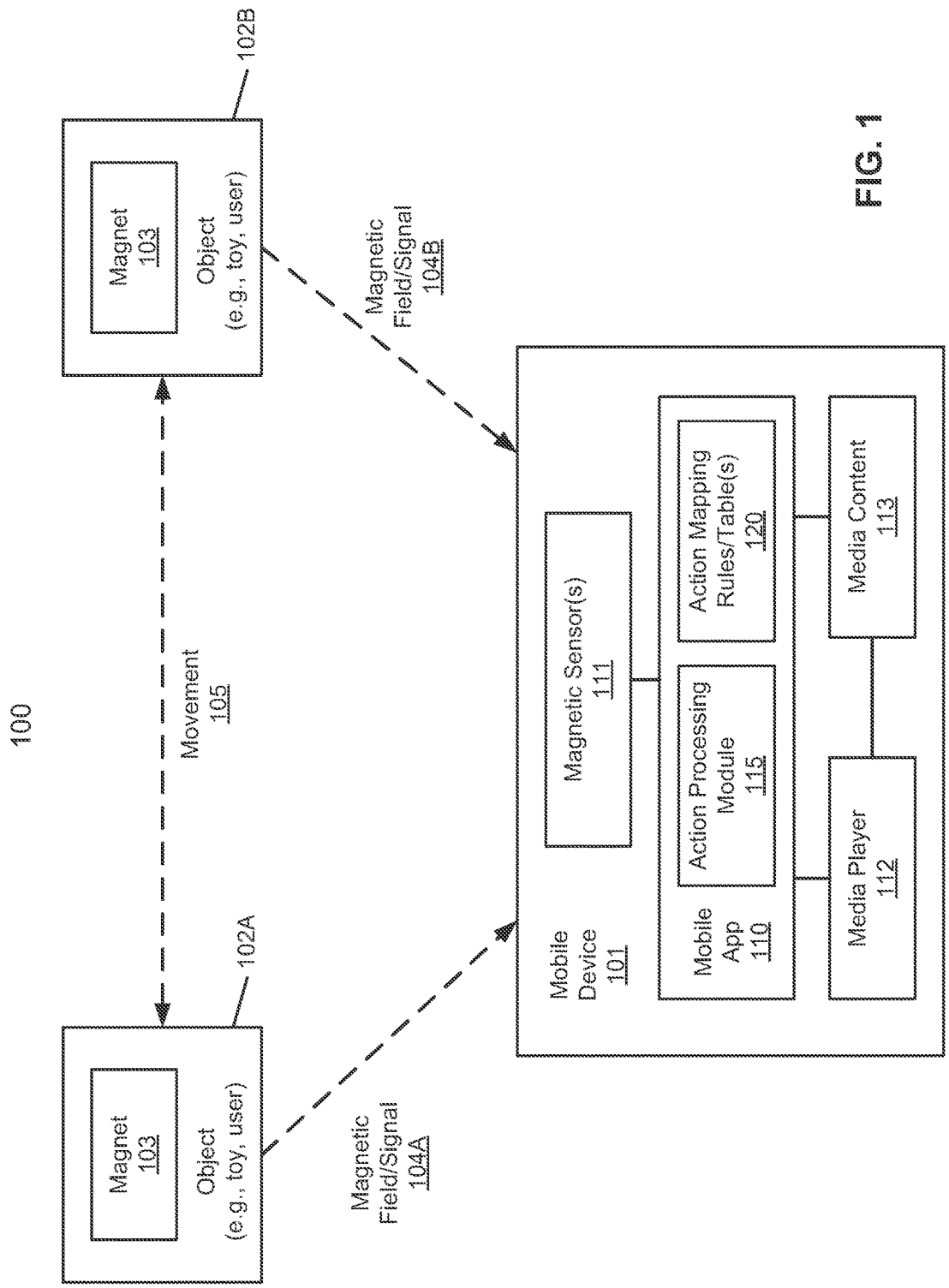

| Previous State/Position | Current State/Position | Action/Media Content |
|---|---|---|
| Position 1 | Position 2 | Play media content item 1 |
| Position 2 | Position 3 | Play media content item 2 |
| ... 401 | ... 402 | ... 403 |

| Current State/Position | Expected State/Position | Action/Media Content |
|---|---|---|
| Still | Moving | Play "Please move" |
| Moving | Still | Play "Please stop" |
| Position 1 | Position 2 | Play "Please move to position 2" |
| Moving Clockwise | Moving Counter Clockwise | Play "Wrong direction" |
| ... 451 | ... 452 | ... 453 |

METHOD AND SYSTEM FOR OPERATING A MOBILE DEVICE USING A MAGNETIC SENSOR

FIELD OF THE INVENTION

Embodiments of the present invention relate generally to mobile devices. More particularly, embodiments of the invention relate to method and system to operate a mobile device using a magnetic sensor.

BACKGROUND

Mobile devices continue to grow in popularity. As mobile telephone technology has increased, so too has the functionality of mobile devices and the different types of mobile devices available to users. For example, many cellular devices now incorporate personal digital assistant (PDA) features such as calendars, address books, task lists, etc. Such multi-function devices may allow users to send and receive electronic mail (email) messages and access the Internet via a cellular network and/or a local area network.

Some mobile devices incorporate contactless card technology or near field communication (NFC) chips. Some mobile devices include a magnetic sensor built in used by an application such as a compass application. However, such a magnetic sensor has not been utilized by a mobile device in other areas.

BRIEF DESCRIPTION OF THE DRAWINGS

Embodiments of the invention are illustrated by way of example and not limitation in the figures of the accompanying drawings in which like references indicate similar elements.

FIG. 1 is a block diagram illustrating a system of operating a mobile device using a magnetic sensor according to one embodiment of the invention.

FIGS. 4A-4B are block diagrams illustrating an action mapping data structure according to certain embodiments of the invention.

DETAILED DESCRIPTION

Figure 2A:
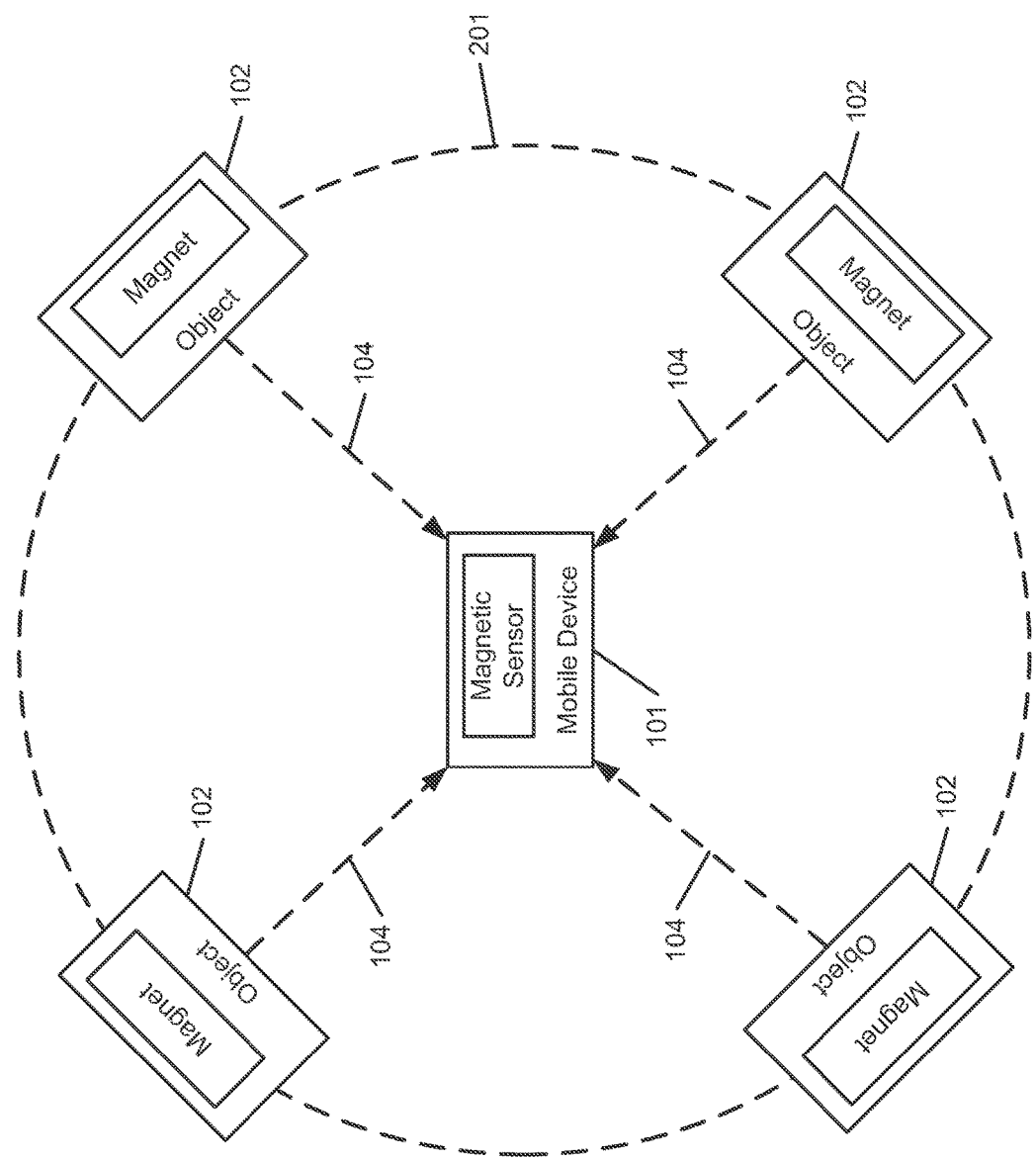
FIGS. 2A-2B are block diagrams illustrating certain configurations of a mobile device with respect to a magnet according to certain embodiments of the invention.

Various embodiments and aspects of the inventions will be described with reference to details discussed below, and the accompanying drawings will illustrate the various embodiments. The following description and drawings are illustrative of the invention and are not to be construed as limiting the invention. Numerous specific details are described to provide a thorough understanding of various embodiments of the present invention. However, in certain instances, well-known or conventional details are not described in order to provide a concise discussion of embodiments of the present inventions.

Reference in the specification to "one embodiment" or "an embodiment" means that a particular feature, structure, or characteristic described in conjunction with the embodiment can be included in at least one embodiment of the invention. The appearances of the phrase "in one embodiment" in various places in the specification do not necessarily all refer to the same embodiment.

According to some embodiments, a mobile device includes a magnetic sensor to detect or sense a magnetic field or magnetic signals originated from a magnet within a predetermined proximity. The magnet may be attached to an object, which may be a toy, a tool, a fixture, a human body, or any other moveable or portable items. The magnet can generate or incur a strong enough magnetic field within a predetermined proximity (e.g., playground, room, building) that allows the magnetic sensor of the mobile device to detect and determine a movement, a direction of movement, and/or a position of the object. On base of the movement's details high-level detections can be derived, such as whether the movement "is swinging", "is escaping", "is circling around a center", etc. In one embodiment, a magnetic sensor of a mobile device receives or detects a magnetic field or magnetic signal from a magnet attached to an object. A magnetic sensor data processing module hosted by the mobile device processes and generates magnetic sensor data based on the detected magnetic field or magnetic signal provided by the magnetic sensor. The magnetic sensor data represents a movement, a direction of movement, or a position of the object having the magnet attached thereon. An action processing module of the mobile device processes the magnetic sensor data to determine a movement of the object with respect to the mobile device, where the mobile device remains in a relatively steady or fixed location or position. Based on the determined movement, of the object, action processing module identifies a predetermined action and causes the predetermined action to be performed within the mobile device.

In one embodiment, the mobile device may track the fact of a movement, the direction of the movement, and/or the position of the object by recording a history of magnetic field or magnetic signal data of the magnet attached to the object in a database or a log. Based on a current movement, a direction of the current movement, and/or a current position of the object, a next action is determined based on a previous action associated with a previous movement, a direction of the previous movement, and/or a previous position of the object. The next action is then performed within the mobile device. The actions to be performed may be maintained in an action mapping data structure (e.g., action mapping table) that maps a particular movement, a direction of a particular movement, and/or a particular position of the object to one or more actions. An action can be playing a predetermined media content item (e.g., audio stream, video stream), turning on or off a light associated with the mobile device, instructing a controller to control another object (e.g., turning a turn table or platform, turning a display device to a particular direction), etc.

FIG. 1 is a block diagram illustrating a system of operating a mobile device using a magnetic sensor according to one embodiment of the invention. Referring to FIG. 1, system 100 include mobile device 101 communicatively coupled to magnet 103 of an object 102 by receiving or detecting a magnetic field or magnetic signal originated form magnet 103 within a proximity over an airspace. Note that for the purpose of illustration only, object 102A and object 102B represent the same object 102 at different locations or positions, where object 102 can move around as indicated path 105 to different locations or turn in different directions. At location or position 102A, mobile device 101 may receive or detect magnetic field or magnetic signal 104A from magnet 103 of object 102. Similarly, at location or position 102B, mobile device 101 may receive or detect magnetic field or magnetic signal 104B from magnet 103 of object 102.

In this example, magnet 103 is attached to or embedded within object 102. Object 102 may be any kind of objects, such as, for example, a toy for the kids, a tool, a fixture or statute, a human body carrying magnet 103. For example, a user (e.g., a child) can wear a wristband having one or more magnets attached therein and move around within a proximity that can be detected by a magnetic sensor of a mobile device. Mobile device 101 can be any kind of mobile devices, such as, for example, a mobile phone or smartphone, a tablet, a laptop, a personal digital assistant (PDA), a gaming device, a smartwatch, a media player, etc. Alternatively, mobile device 101 can be a desktop or server.

In one embodiment, mobile device 101 includes or is coupled to one or more magnetic sensors 111. Magnetic sensor 111 can sense or detect magnetic fields or signals 104A-104B dependent upon where object 102 is located. Magnetic sensor 111 may in turn generate an electrical signal or magnetic sensor data representing the detected magnetic field or signal in a two-dimensional (2D) or three-dimensional (3D) positioning or location data of magnet 103 of object 102.

Based on the magnetic sensor data, action processing module 115, which may be hosted within a mobile application 110 is to determine an action to be performed. The determined action is then performed within mobile device 101. An action may be determined based on one or more action mapping rules or tables 120. An action may be determined further based on the history of movements of object 102, which may be maintained or tracked in a history log (not shown). A next action may be different based on a previous action taken and a previous movement of object 102. Action mapping rules or tables 120 may be configured to map a particular movement of magnet 103, a direction of the movement, and/or a position of magnet 103 to one or more predetermined actions. Note that action mapping rules or tables 120 can be maintained in a variety of data structures (e.g., databases, arrays, lookup tables).

For example, an action can be playing a particular media content item of media content 113 using media player 112, where media content 113 may be maintained as part of a media store in a persistent storage device (e.g., hard disk, not shown). In this example, action processing module 115 and action mapping table 120 are hosted within mobile application 110. Mobile application 110 may be a gaming application in which a user interact with a game of a particular gaming scene based on user's movement by carrying magnet 103 or object 102. Mobile application 110 may be an child educational application such as storytelling software or electronic books (eBooks). Alternatively, action processing module 115 and action mapping table 120 may be configured as separate modules, which may be implemented in software, hardware, or a combination thereof. Also note that although there is only one mobile device shown, multiple mobile devices may be implemented to communicate with each other to detect and measure the magnetic fields or signals, and to coordinate or corporate with each other to determine an action to be performed.

Figure 2B:
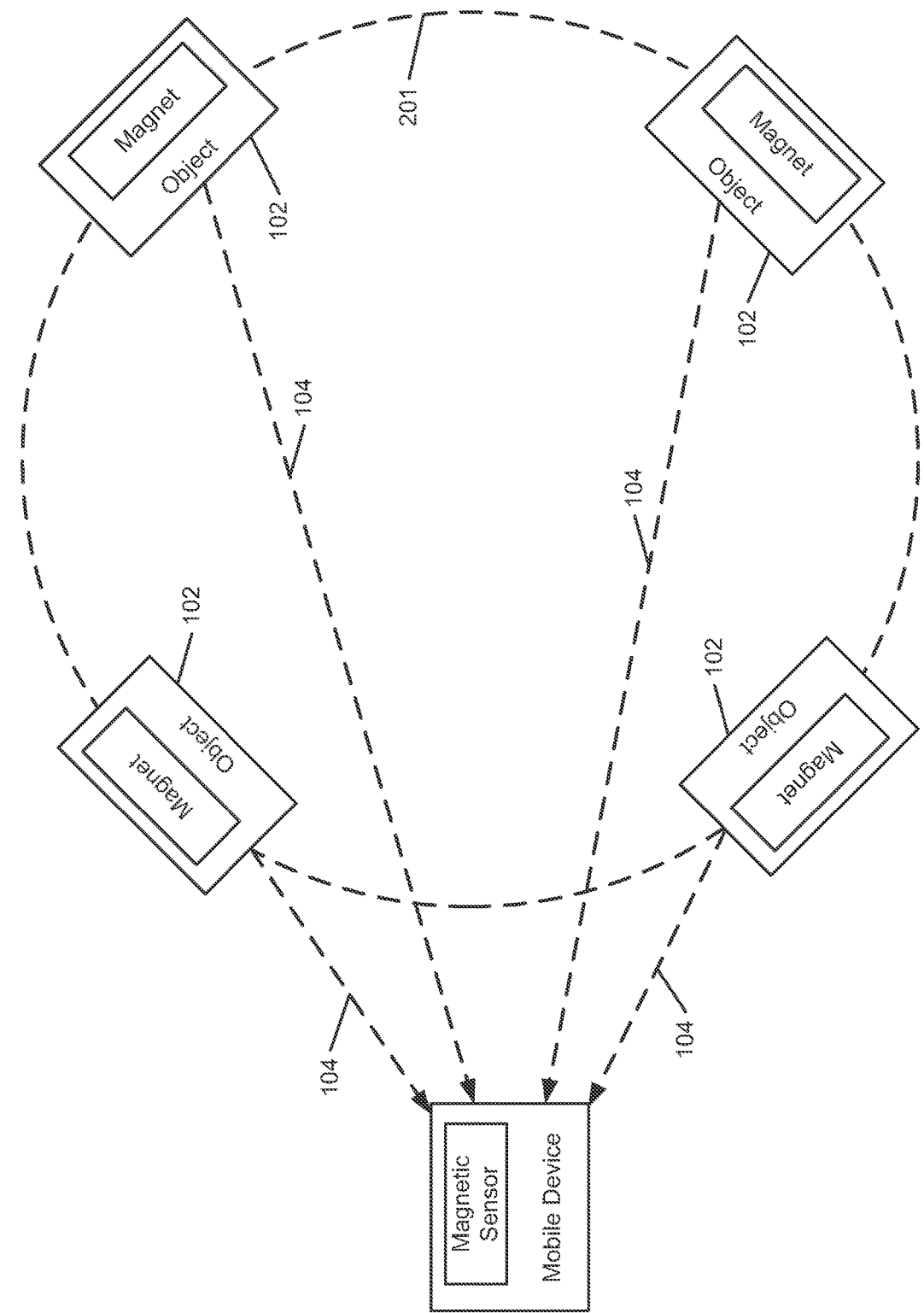

FIGS. 2A-2B are block diagrams illustrating certain configurations of a mobile device with respect to a magnet according to certain embodiments of the invention. Referring to FIG. 2A, in this example, mobile device 101 is positioned in a steady position such as center of a predetermined area or proximity 201. The size of area 201 depends on the strength of a magnetic field or signal 104 of a magnet of object 102 that can be detected or received by the magnetic sensor of mobile device 101. Area 201 can represent a playground or a show room, etc. Object 102 can move around within area 201. As object 102 moves around, the magnet attached to object 102 also moves and the orientation of the magnet may change. Such movement and change of orientation of the magnet cause the magnetic field to change, which may be detected or captured by the magnetic sensor of mobile device 101. Such changes of the magnetic field can be one dimensional or 1D (e.g., a change of magnitude or strength), 2D (e.g., changes of strength and direction), or 3D (e.g., changes of strength, horizontal direction, and vertical direction). FIG. 2B shows another scenario in which mobile device 101 is located outside of the moving area 201 of object 102.

In one embodiment, by tracking movements of the magnet attached to object 102, mobile device 101 can determine: 1) whether object 102 moves (or just the fact of a movement), 2) a direction of the movement, and/or 3) a position of the magnet. A magnet, such as magnet 103, used therein can be any kind of magnets, such as, for example, a permanent magnet or an electromagnet. A magnet is a material or object that produces a magnetic field. This magnetic field is invisible but is responsible for the most notable property of a magnet: a force that pulls on other ferromagnetic materials, such as iron, and attracts or repels other magnets. A permanent magnet is an object made from a material that is magnetized and creates its own persistent magnetic field. Materials that can be magnetized, which are also the ones that are strongly attracted to a magnet, are called ferromagnetic (or ferromagnetic). These include iron, nickel, cobalt, some alloys of rare earth metals, and some naturally occurring minerals such as lodestone.

A magnetic sensor, such as magnetic sensor 111, can be any kind of magnetic sensors, such as, for example, magnetometers. Magnetometers are measurement instruments used to measure the magnetization of a magnetic material like a ferrimagnet or to measure the strength and, in some cases, the direction of the magnetic field at a point in space. Magnetic fields are vector quantities characterized by both strength (magnitude) and direction. By tracking the movements (e.g., in 1D, 2D, and/or 3D), the mobile device can determine: 1) whether the object is moving; 2) the direction of the movement (e.g., clockwise or counter clockwise);

and/or 3) a position of the object based on 3D magnetic sensor data. An action is then determined based on whether the object moves and/or how the object moves. An action can include playing a predetermined media content (e.g., audio stream or video stream), which may be related to a game or an educational program hosted by the mobile device. Although area 201 is shown in a substantially circular shape, however, area 201 can be any shape.

Figure 3:
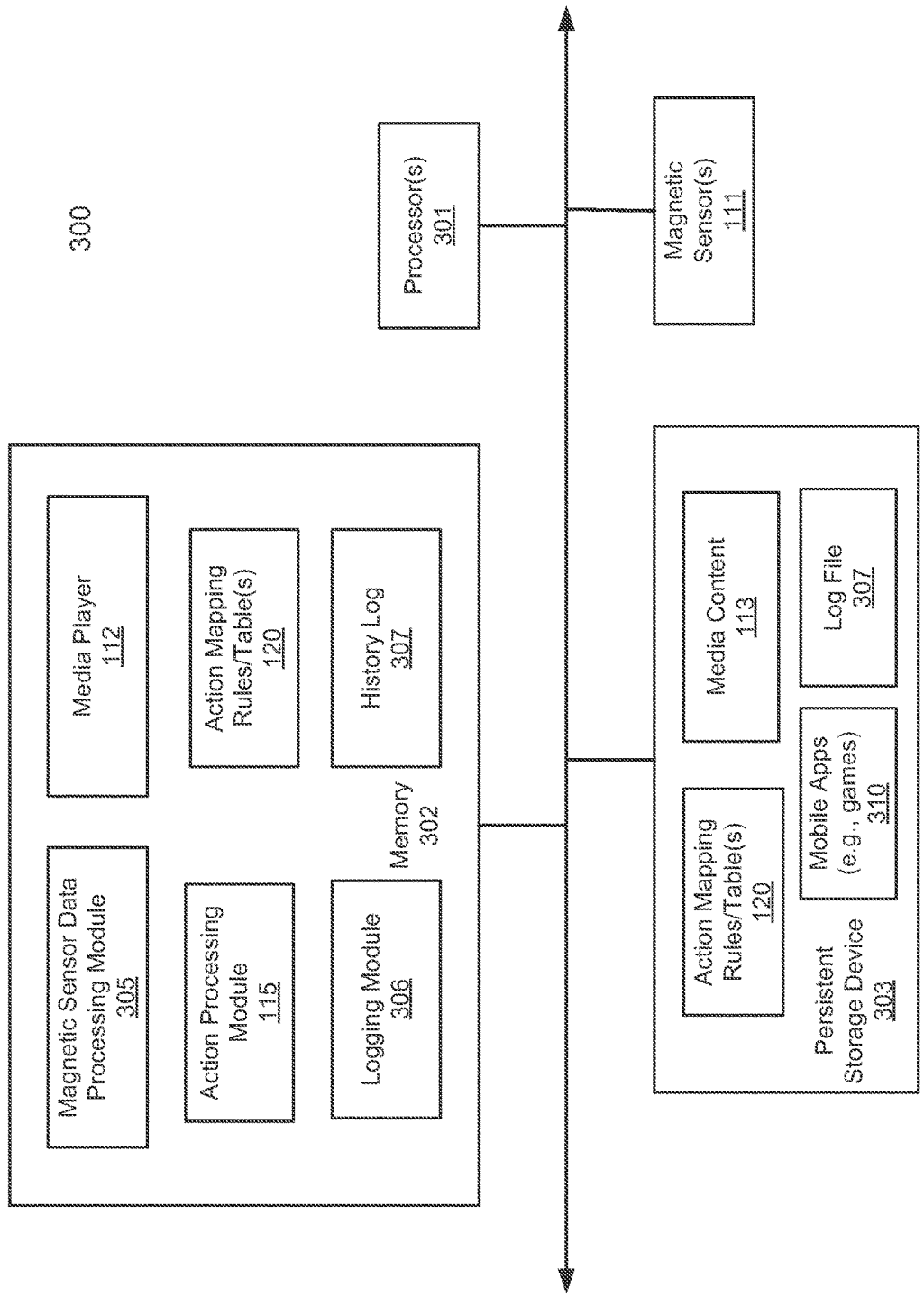
FIG. 3 is a block diagram illustrating an example of a mobile device according to one embodiment of the invention.

FIG. 3 is a block diagram illustrating an example of a mobile device according to one embodiment of the invention. Mobile device 300 may represent mobile device 101 of FIG. 1. Referring to FIG. 3, in this example, action processing module 115 and action mapping table 120 are loaded in memory 302 and executed by one or more processors 301. In one embodiment, action processing module 115 and action mapping table 120 may be part of a mobile application that is stored as part of mobile applications 310 in persistent storage device 303. Memory 302 can be any kind of volatile memory such as random access memory (RAM). Persistent storage device 303 can be any kind of non-volatile storage device such as hard disks. Processor(s) 301 can be any kind of processors, such as a central processing unit or CPU. These components are coupled to each other over an interconnect 315, which may be a bus or a point-to-point connection.

In one embodiment, mobile device 300 includes or is coupled to one or more magnetic sensors 111. Magnetic sensor 111 can sense or detect magnetic fields or signals generated from a magnet of an object dependent upon where the object is located. Magnetic sensor 111 may in turn generate an electrical signal or magnetic sensor data representing the detected magnetic field or signal, which may be processed by magnetic sensor data processing module. The magnetic sensor data may also be logged by logging module 306 and stored as part of history log 307, which may be stored in persistent storage device 303 as part of log file 307. Magnetic sensor data processing module 305 determines, by using real-time magnet sensor data and its history log, whether the object is moving based on the magnetic sensor data (e.g., 1D sensor data). Alternatively, magnetic sensor data processing module 305 may determine a direction of the movement based on the magnetic sensor data (e.g., 2D sensor data). Furthermore, magnetic sensor data processing module 305 may determine a position of the object based on the magnetic sensor data (e.g., 3D sensor data). The data presenting whether an object is moving, a direction of the movement, and/or a position of the object is referred to as movement data of the object.

Based on the magnetic sensor data and/or the movement data, action processing module 115, which may be hosted within a mobile application, is to determine an action to be performed. The determined action is then performed within mobile device 300. An action may be determined based on one or more action mapping rules or tables 120. An action may be determined further based on the history of movements of the object, which may be maintained or tracked in history log 307. A next action may be different based on a previous action taken and a previous movement of the object. Action mapping rules or tables 120 may be configured to map a particular movement of a magnet, a direction of the movement, and/or a position of the magnet to one or more predetermined actions. Note that since a magnet is attached to an object, the movement of the magnet represents the movement of the object accordingly.

For example, an action can be playing a particular media content item of media content 113 using media player 112. Media content 113 may be maintained as part of a media store in persistent storage device 303. Media content 113 and mobile applications 310 may represent games that can be played in mobile device 300. For example, a mobile application may be a gaming application in which a user interact with a game of a particular gaming scene based on user's movement by carrying the magnet or the object. Alternatively, action processing module 115 and action mapping table 120 may be configured as separate modules, which may be implemented in software, hardware, or a combination thereof. Also note that although there is only one mobile device shown, multiple mobile devices may be implemented to communicate with each other to detect and measure the magnetic fields or signals, and to coordinate or corporate with each other to determine an action to be performed. Cooperation among mobile devices is not limited to evaluate the magnet field and exchange the measured values. For example, each mobile device may also take over a role (e.g., becoming a "master device", or visually and/or acoustically representing a specific figure or element of the game or story in terms) within the actual game or story depending on the toy's position inside this multi-device playground.

FIGS. 4A-4B are block diagrams illustrating an action mapping data structure according to certain embodiments of the invention. Referring to FIG. 4A, in this example, action mapping data structure 400 is implemented as an action mapping table, which may represent any of the action mapping data structures described above, such as action mapping table 120. Action mapping table 400 includes multiple mapping entries, each entry mapping a particular state or particular position or move of a magnet (e.g., an object) to a particular action. In this example, given a previous state or position 401 and a current state or position 402, an action identified in field 403 will be performed. Previous state/position 401 and current state/position 402 may be determined based on the magnetic sensor data compiled based on magnetic field or magnetic signal detected by a magnetic sensor as described above. Previous state/position 401 and current state/position 402 may also be recorded by logging module 306 and stored as part of history log 307. In this particular example, if the previous position of the magnet is "position 1" while the current position of the magnet is "position 2" determined based on the magnetic sensor data, media content item 1 will be played via a media player.

FIG. 4B shows an alternative embodiment of an action mapping table. Referring to FIG. 4B, action mapping table 450 includes multiple entries. Each entry maps an action 453 to be performed based on a current state/position 451 vs. an expected state/position 452. For example, as shown in FIG. 4B, if the current state of an objection (with a magnet attached thereon) is determined still (e.g., not moving for a predetermined period of time), while an application (e.g., game) expect the object moving, a media content "please move" will be played via a media player. Note that the specific examples as shown in FIGS. 4A-4B are described for the purpose of illustration only. Other rules or formats may also be applicable.

Figure 5:
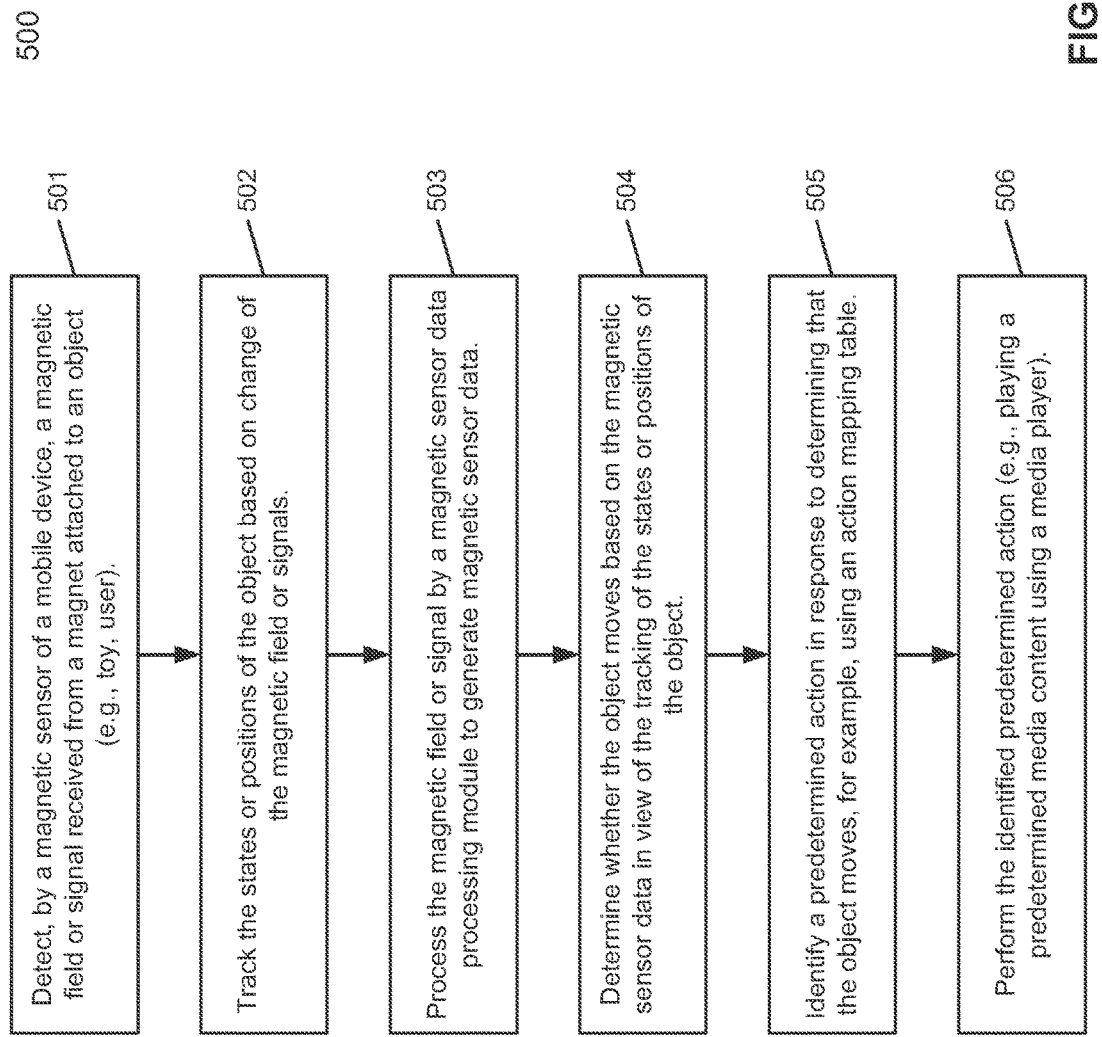
FIG. 5 is a flow diagram illustrating a process of operating a mobile device using a magnetic sensor according to one embodiment to of the invention.

FIG. 5 is a flow diagram illustrating a process of operating a mobile device using a magnetic sensor according to one embodiment to of the invention. Process 500 may be performed by processing logic which may include software, hardware, or a combination thereof. For example, process 500 may be performed by mobile device 300 of FIG. 3. Referring to FIG. 5, at block 501, a magnetic sensor of a mobile device detects or receives a magnetic field or signal originated from a magnet attached to an object (e.g., toy, tool, fixture, user). At block 502, processing logic tracks the movement data such as states or positions of the magnet/object based on the changes of the magnetic field/signal. The history of the movement data may be recorded and stored in a log file. At block 503, processing logic processes the magnetic field/signal by a magnetic sensor data processing module to generate magnetic sensor data. At block 504, processing logic determines whether the magnet/object moves based on the magnetic sensor data, for example, in view of the tracking of the movements of the magnet/object. The determination is performed while the mobile device remains in a relatively steady or the same location or position. At block 505, processing logic identifies a predetermined action in response to determining that the magnet/object moves, for example, using an action mapping table. At block 506, the predetermined action is performed within the mobile device, such as, for example, playing a media content (e.g., audio stream, video stream) or sending a control signal to control another object (e.g., a motor of a turntable).

The techniques described above can be applied to a variety of scenarios. For example, the techniques can be applied to a toy or tool having a magnet attached thereon and a gaming or educational application running within a mobile device. By attaching a magnet to an object such as a toy or tool, or in case the toy or tool already includes a magnet, the toy or tool can be combined with a specifically reacting application in the field of gaming, storytelling, teaching and more. Any toy, tool or figure can be enriched by a magnet. This allows making games/stories that may react on scenarios like: a) the application advises a user to move, but user does not, b) the application advises the user not to move, but user still moves, c) the application continues doing something as long as the toy, tool or user continues moving, and may recognize any stop or restart to react specifically, d) the application continues "acting" as long as from time to time (e.g., in predetermined time intervals) there is a specific movement ("stop & go" with a minimal go-rate is recognized as "fine").

All kinds of games or entertainment or teaching or monitoring processes where the user could express his or her answer or advice to the application by positioning something (1 thing) around the mobile device. For example, "1 of 4 answers is right game", and the user has to place the magnet at the 12, 3, 6 or 9 a clock position. All applications that contribute anything as long as the related main object is moved, or if the objects comes into a closer sphere. The application may detect "stop of movement", and may react with continuing the game or story, or with starting a new section. Correspondingly the application can act specifically if object's movement starts or restarts. All applications where it is necessary to detect and measure the user's movement of the user or any object (the relevant object has to carry the magnet). This movement detection could even be applied in the non-game field. For example, an alarm if something is not moving within a given period.

Principally the application may recognize the fact of an object's or user's penetration of an area by detecting a significant change of the magnetic field. One of the advantages with magnetic field is given with the additional information of a direction or position in a 2D or 3D magnetic sensor data. Via the additional information of a direction (e.g. clockwise- or counter-clockwise turn) the app may react more differentiated, perform plausibility checks on the user's obedience or choice selection, and much more. Depending on the game and toy or tool, different scenarios are possible on how the mobile device can be placed in relation to the moving toy's or tool's track. In some games there is an actual track given, in other games there is no real track, but really free movement possible.

In addition, depending on the game and toy or tool, different scenarios are possible on how the mobile device can be placed in relation to the moving toy's or tool's track. In some games there is an actual track given, in other games there is no real track, but really free movement possible. The entire scenario may also be 3D. For example, if a round track includes a "hill" or "ramp". Or if a user has a typical play house with several floors, rooms and also an area in front of the house. The position information determined based on magnetic sensor data provides enough information to let the game/story teller differentiate the scenarios.

In another scenario, the mobile device may be placed in different attitudes: a) it lies flat so that x and y almost represent the ground floor, and z expresses the altitude. B) Stands with any angle to the floor (for better readability), so that definitely x, y and z together represent a "special" space where x and y no longer corresponds to the floor (playground). The application's calibration allows the application proper recognition and interpretation of its magnetic field sensor's values. The fact of movement ("principal movement") is definitely detectable without any calibration.

Due to the general characteristic of magnet field's measurement, such as the already mentioned "slight inertia" of the sensor, etc. it's very supportive for the algorithms to know something about the game field and the mobile device's position. However, a movement of a magnet is detectable without calibration by just monitoring the magnetic sensor's values and removing the signals' noise.

During the calibration, a mobile device may be positioned in accordance to the game ground's shape and principals, and its magnet sensor is controlled by the earth magnet field as well as all other magnet field sources in its environment, such as loud speakers, etc. It is also influenced by the potentially already laying around objects' (toy's or tool's) magnet (attached or just laying around), or any magnets that are not part of the game field. Concerning the x, y, and z values interpretation (e.g. in order to detect any "altitude" of the object) the mobile device may also use its other sensors to determine its orientation in space. This allows a kind of self-calibration.

Within this overall static start situation of the game scene, the sensor actually does not know anything about the object's (toy's or tool's) magnet or any movement shape. Even the application (via the sensor) does not know anything about its field of application it already now may detect object's (toy's or tool's) principal movement (assuming the magnet was attached) since this will simply change the magnet field. Actually no calibration is necessary.

Any required calibration effort primarily depends on whether the game needs to detect some "principal/specific positions" or not (i.e. is already happy in case it only knows about the fact of any movement). For example, for supporting a position detection the application may ask the user for a principal game field style/arrangement (shape of game field, and mobile device's position within the game field, attachment/embedment of the magnet). In another scenario, the application may ask the user to place the magnetic toy or tool to specific positions in order to measure and capture the resulting field. This position does not only provide reference to x and y dimension, but also to z ("altitude"). For movement detection without any "positioning", i.e. with just detecting "is moving"-"is standing", there is no calibration necessary in order to detect any effective movement. However, the application's "movement detection" algorithms may significantly be improved and sharpened if they know something about the play ground's shape and structure (like in the previous point.

In addition to the gaming situations, according to another embodiment, the techniques described above can also be applicable to other scenarios, such as, for example, controlling a second object (e.g., movement of the second object) based on the magnetic sensor data representing the movement of a first object having a magnet attached thereon.

Figure 6:
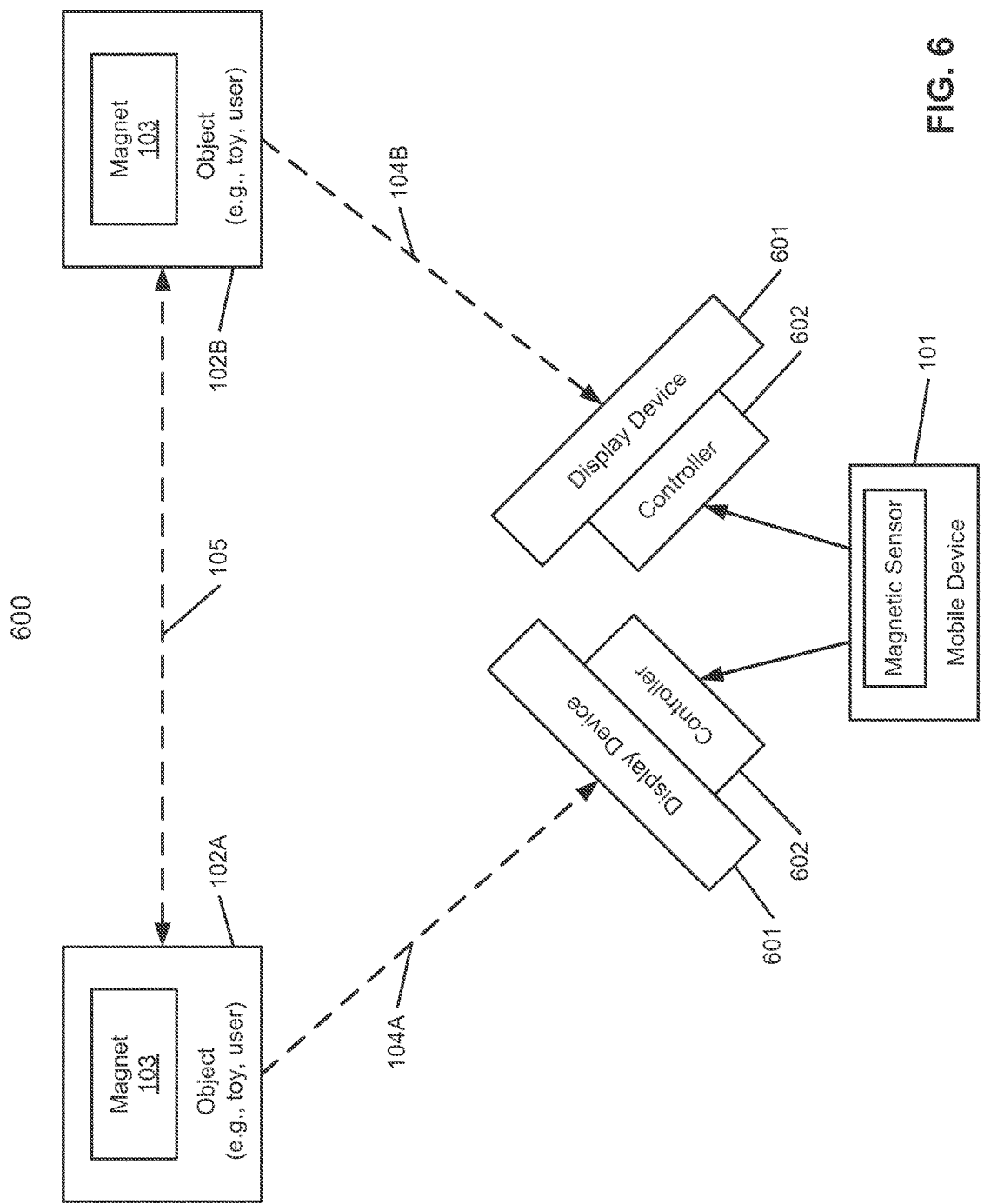
FIG. 6 is a block diagram illustrating an example of system configuration of operating a mobile device according to another embodiment of the invention.

FIG. 6 is a block diagram illustrating an example of system configuration of operating a mobile device according to another embodiment of the invention. Referring to FIG. 6, as object 102 having magnet 103 attached thereon moves from one location indicated as 102A to another location indicated as 102B via path 105, the magnetic fields or signals received by the magnetic sensor of mobile device 101 via paths 104A-104B can be different in terms of the magnitude, direction, and/or angles of the magnetic fields or signals as described above. Based on the changes of the magnetic fields and in view of the tracking of the prior movements, mobile device 101 can calculate or determine the current direction or position of object 102. Mobile device 101 can control the movement of another object 601, in this example, a display device, based on the determined current direction or position of object 102. Based on the magnetic sensor data, mobile device 101 can instruct one object to follow another object, etc.

In one embodiment, if it is determined that object 102 moves from a prior position as indicated as object 102A to a current position as indicated as object 102B, mobile device 101 can determine the current angle or direction of object 102B as indicated as direction 104B based on the magnetic sensor data. Mobile device 101 can send an instruction or command to controller 602 that controls the movement of object 601 to turn or move from a prior position facing object 102A to a new position facing object 102B.

For example, mobile device 101 may have a display device or be associated with a display device 601 placed on a turntable or support platform. Object 102 represent a user having a magnet attached to its body, where the user may perform a presentation in a show room. By detecting the movement of the user (e.g., object 102), mobile device 101 can control and turn the screen of display device 601 to face the user, such that the user can see the content displayed on display device 601 most of the time.

For example, an application (e.g., a gaming application or educational software) may differentiate a set of significantly differentiable positions. For example, the 12, 3, 6 and 9 o'clock positions of a circular area (e.g., a playground). But this is just an example, and the differentiation may be more filigree. The overall quality of this position determination depends on where in the game or playground the mobile device is located. The quality of the position information can be improved step-wise by including more information, such as the angle/orientation of the magnetic field as well as the signal's or field's strength.

Since the application knows about a position and also "feels" related changes it could also react in a way that it turns the screen (not moving the device, just the screen) so that the screen can always be watched best (in proper orientation) from the user's direction. This is necessary, for example, in case the child would move around the game ground together with the toy or tool. The controller can be accessed and advised by the mobile device itself to turn itself in any direction. The required connection is done by Bluetooth, for example, or any other method. Means, if the application knows the "principal" position of the magnet (e.g., position of the playing person, since the toy or tool will also be there) it can turn the plate in such a way that the user always see the screen completely from the front. A child can play all around the game field and is always able to watch the screen properly. For another usage of this self-rotary platform, the mobile device could keep track of the person (wearing a magnet or keeping the toy or tool in hand), such as for gaming, filming or capturing a video or images of it.

Figure 7:
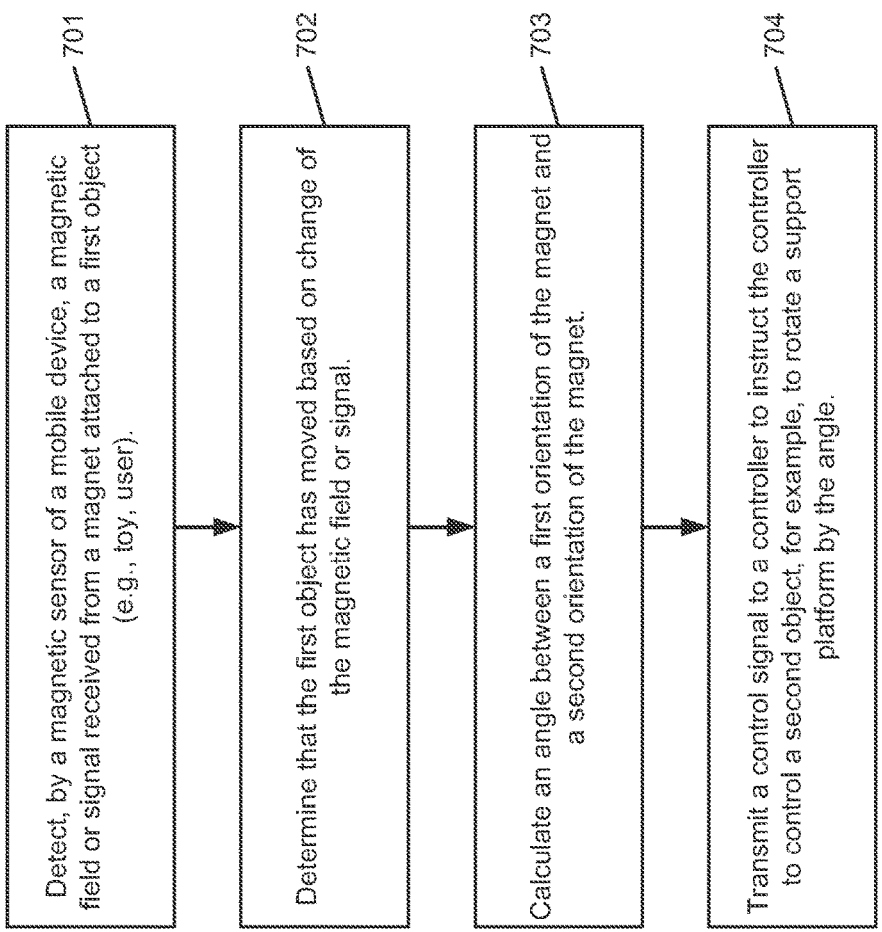
FIG. 7 is a flow diagram illustrating a process of operating a mobile device using a magnetic sensor according to another embodiment of the invention.

FIG. 7 is a flow diagram illustrating a process of operating a mobile device using a magnetic sensor according to another embodiment of the invention. Process 700 may be performed by processing logic which may include software, hardware, or a combination thereof. For example, process 700 may be performed by mobile device 300 of FIG. 3. Referring to FIG. 7, at block 701, a magnetic sensor associated with a device (e.g., a mobile device) detects a magnetic field or signal received from a magnet attached to an object (e.g., a toy, tool, human body). In response to the magnetic field/signal, at block 702, processing logic determines that the object has moved based on the change of the magnetic field or signal in view of the prior magnetic sensor data. At block 703, processing logic calculates an angle between a first orientation of the magnet (e.g., a prior orientation) and a second orientation of the magnet (e.g., a current or new orientation), for example, using a predetermined algorithm. At block 704, processing logic transmits a control signal to a controller to instruct the controller to control a movement of a second object (e.g., support platform or turntable), for example, by rotating the second object by the calculated angle.

The concept described above can be extended by using several mobile devices with a magnetic sensor therein to individually or independently detect, collect, and measure the magnetic fields or signals received from a magnet of an object. Each of the mobile devices is to generate magnetic sensor data representing movements of the object. The mobile devices communicate with each other to exchange or collaborate the magnetic sensor data to determine a movement, a direction of movement, and/or a position of the object. In one embodiment, one of the mobile devices is selected as a master or primary mobile device, while the remaining mobile devices operate as a slave or secondary devices.

Figure 8:
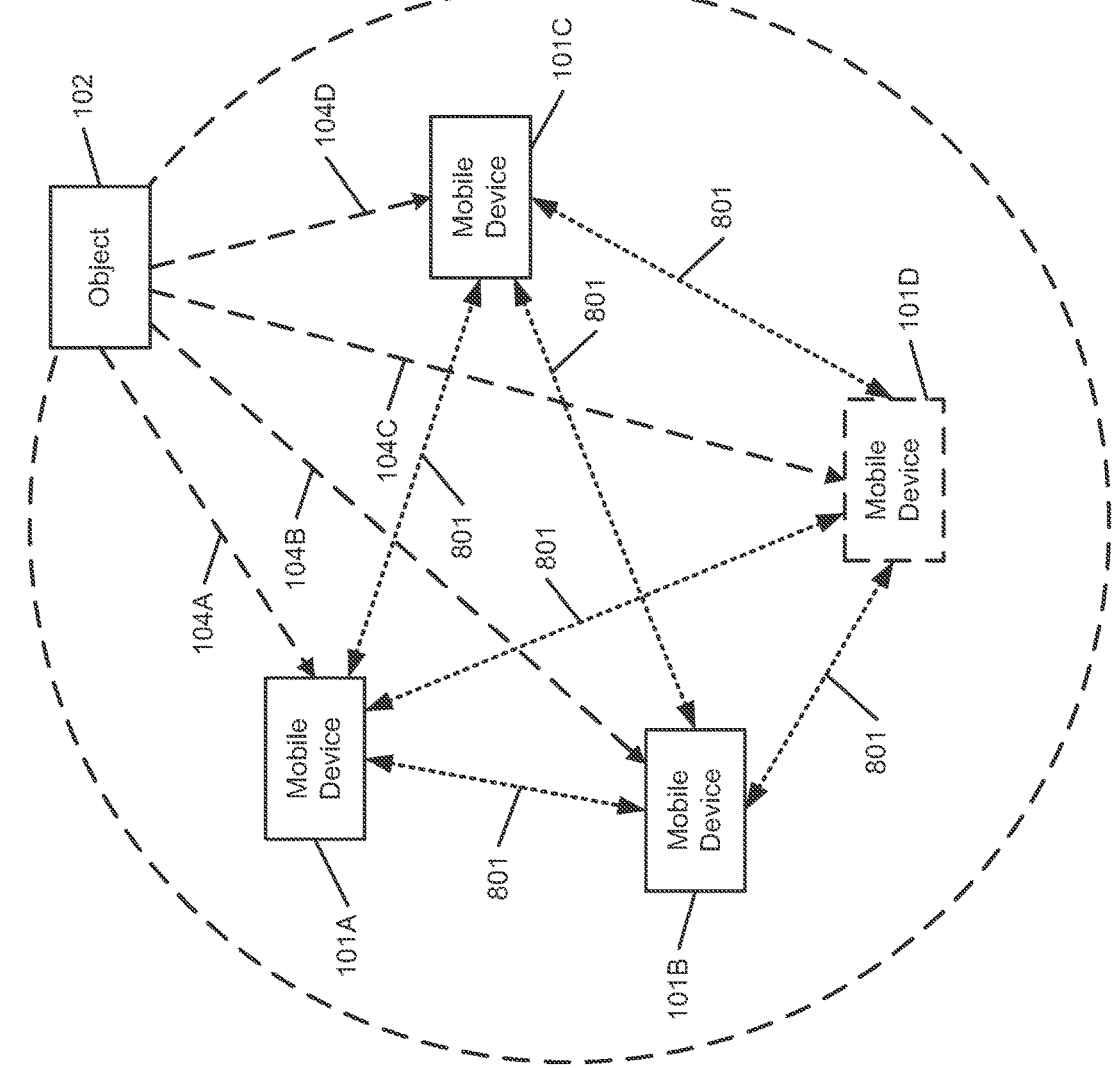
FIG. 8 is a block diagram illustrating a system of operating multiple mobile devices using magnetic sensors according to one embodiment of the invention.

FIG. 8 is a block diagram illustrating a system of operating multiple mobile devices using magnetic sensors according to one embodiment of the invention. Referring to FIG. 8, in this embodiment, multiple mobile devices 101A-101D are distributed within a predetermined area 201, which may be a playground, a hall, a room, a house, etc. Although there are four mobile devices shown, more or fewer mobile devices may also be applied herein. Each of mobile devices 101A-101D communicate with each other via a wireless communication mesh 801 (e.g., Bluetooth, WiFi, Infrared, near field communication or NFC). Each of the mobile devices 101A-101D includes a magnetic sensor to detect, receive, and measure the magnetic field or signal from a magnet of object 102. Mobile devices 101A-101D may exchange with each other over communication mesh 801 information of the magnetic sensor data compiled locally. Mobile devices 101A-101D corporate with each other to determine the movement, direction of movement, and/or a position of object 102 based on the magnetic sensor data. The multi-mobile device configuration allows the coverage of a wider range or improving the precision.

According to one embodiment, one of mobile devices 101A-101D is selected as a master or primary device, while the remaining devices operate as slave or secondary devices, according to a predetermined selection algorithm or protocol. Each of mobile devices 101A-101D is designed to cover its own "local" territory, and collectively, mobile devices 101A-101D cover the entire area 201. Based on the magnetic sensor data collected from all mobile devices 101A-101D, each of mobile devices 101A-101D determines whether the mobile device should operate as a master device. If a mobile device determines that it should be the master device, it may communicate with the reset of the mobile devices to announce its master device role. A handover or handshaking mechanism or protocol may be implemented to resolve any possible contention of becoming a master device.

For example, a device having a strongest magnetic field detected may be selected as a master device. A master device will collect all the magnetic sensor data from the remaining devices and determine a movement, a direction of movement, and/or a position of the object. A secondary or slave device will compile and send the magnetic sensor data to the master device to allow the master device to determine a movement, a direction of movement, and/or a position of the object, and/or to sharpen its own results. Dependent upon the movement of object 102, a master device may be periodically selected from the mobile devices 101A-101D. The switching of a master device amongst mobile devices 101A-101D can also be determined based on other factors other than the magnetic sensor data, such as, for example, the specific workload or resources of a particular mobile device. With multiple devices collecting and measuring magnetic data, the determination of the movement of the object can be more accurate.

In addition, a master device can instruct a secondary device to perform certain actions. For example, if the master device determines that a secondary device is near the object, the master device may instruct the secondary device to play a particular media content (e.g., audio stream, video stream) or capture an image of the object, etc. In a playground situation, when several kids are playing, each kid could be in its own corner or area covered by a dedicated mobile device. Each kid plays with an own "magnetic toy or tool" monitored by its own device. There could be an overall game, storytelling coordinator that brings all kids into a common context. Alternatively, one kid may have split the playground into two areas, and each is monitored by an own device, and both devices cooperate.

Figure 9:
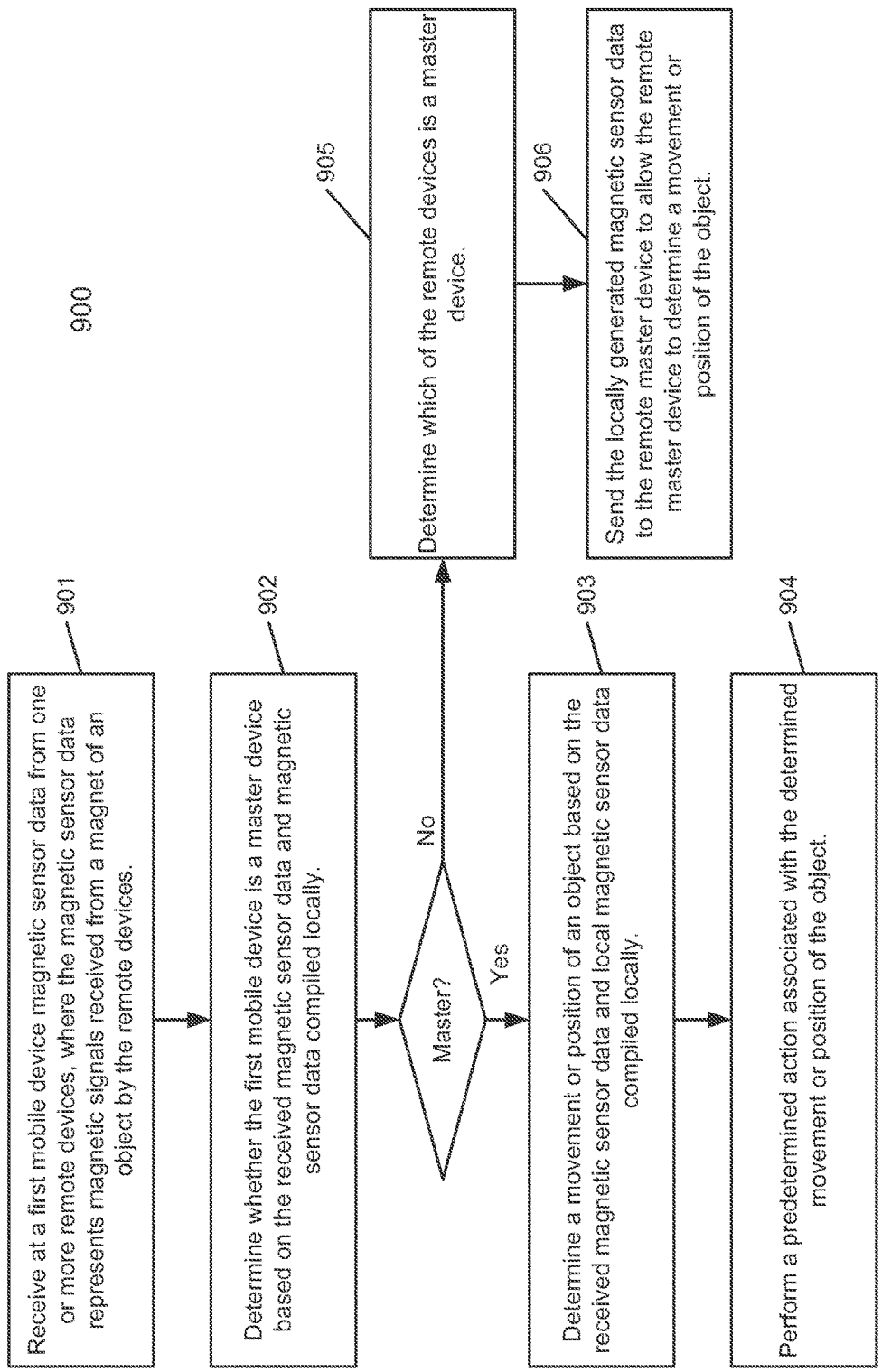
FIG. 9 is a flow diagram illustrating a process of operating a mobile device using a magnetic sensor according to one embodiment of the invention.

FIG. 9 is a flow diagram illustrating a process of operating a mobile device using a magnetic sensor according to one embodiment of the invention. Process 900 may be performed by processing logic which may include software, hardware, or a combination thereof. For example, process 900 may be performed by mobile device 300 of FIG. 3. Referring to FIG. 9, at block 901, processing logic of a first mobile device receives magnetic sensor data from one or more remote devices. The magnetic sensor data represents magnetic fields or signals received from a magnet of an object by the remote devices. At block 902, processing logic determines whether the first mobile device is or should be a master device based on the received magnetic sensor data and the magnetic sensor data compiled locally. If it is determined the first mobile device is a master device, at block 903, processing logic determines a movement, a direction of movement, and/or a position of the magnet/object based on the magnetic sensor data received from the remote devices and the magnetic sensor data generated locally. At block 904, processing logic causes an action to be performed at the first mobile device based on the movement of the object/magnet. If it is determined that the first mobile device is not a master device, at block 905, processing logic determines which of the remote devices is a master device based on the magnetic sensor data generated remotely and locally. At block 906, processing logic sends the locally generated magnetic sensor data to one of the remote devices that operates as a master device to allow the master device to determine the movement of the object/magnet.

Figure 10:
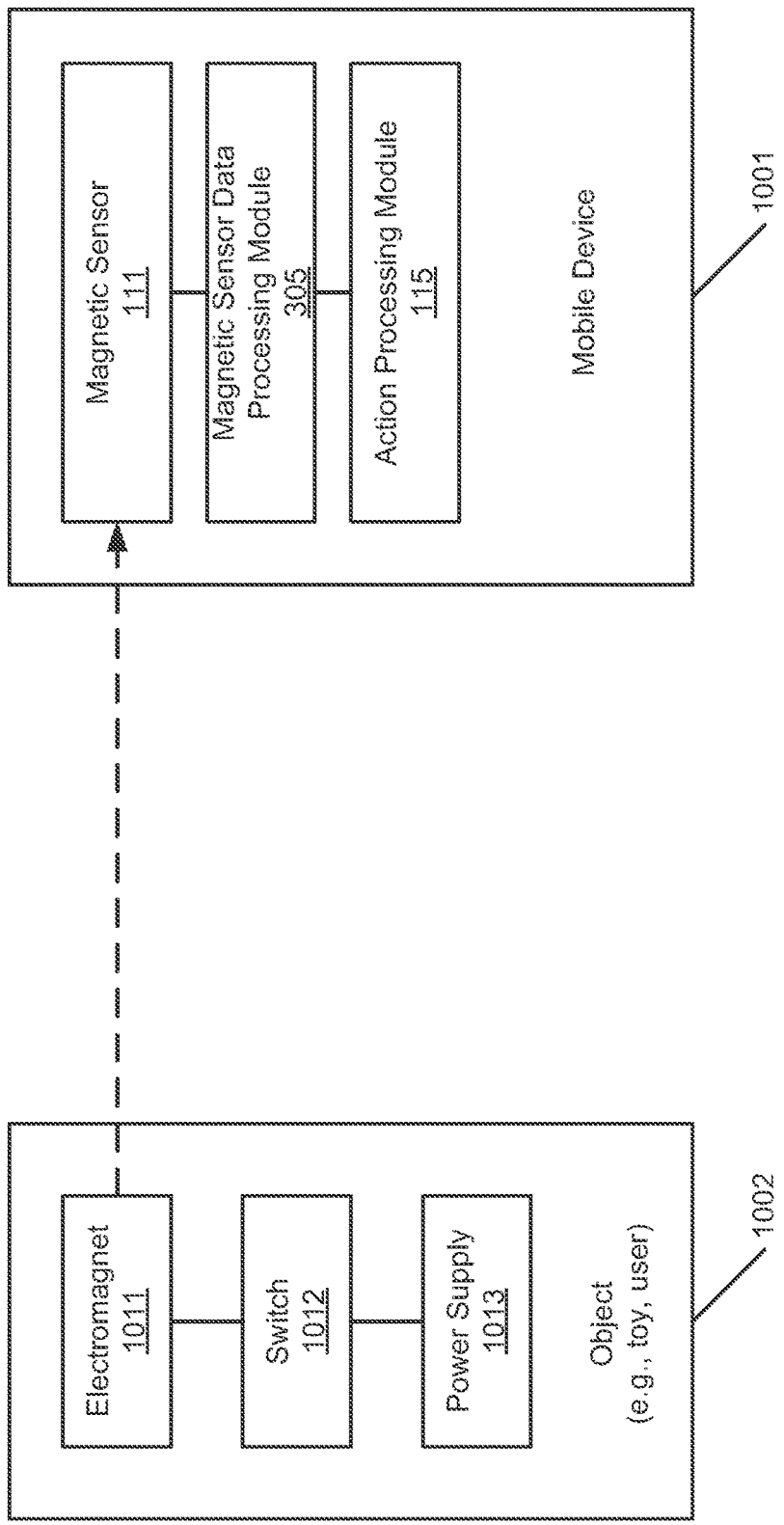
FIG. 10 is a block diagram illustrating a system of operating a mobile device using a magnetic sensor according to another embodiment of the invention.

FIG. 10 is a block diagram illustrating a system of operating a mobile device using a magnetic sensor according to another embodiment of the invention. Referring to FIG. 10, mobile device 1001 includes magnetic sensor 111 to detect or receive magnetic fields or signals from magnet 1011 of object 1002. Mobile device 1001 may present mobile device 101 and object 1002 may represent object 102 of FIG. 1. In this embodiment, magnet 1011 attached to object 1002 is an electromagnet.

An electromagnet is made from a coil of wire that acts as a magnet when an electric current passes through it but stops being a magnet when the current stops. Often, the coil is wrapped around a core of ferromagnetic material such as steel, which greatly enhances the magnetic field produced by the coil. The overall strength of a magnet is measured by its magnetic moment or, alternatively, the total magnetic flux it produces. The strength of magnetism in a material is measured by its magnetization.

Electromagnet 1011 will generate a magnetic field or signal in response to an electric current supplied by power supply 1013 (e.g., battery) and turned on by switch 1012. When switch 1012 turns on, the electric current goes through a coil of electromagnet 1011, which in turn generates a magnetic field in a form of an impulse. Such magnetic field is detected and captured by magnetic sensor 111 and processed by magnetic sensor data processing module 305. Magnetic sensor data processing module 305 generates magnetic sensor data representing the magnetic impulse. Action processing module can then determine an action to be performed.

In this example, a user carrying object 1002 can operate switch 1012 to generate a burst or stream of magnetic fields or signals. In a toy, tool or gaming situation, electromagnet 1011 would allow the user to send an additional impulse-like signal from object 1002 to mobile device mobile device to further control a detail of the story or game. For example, switch 1012 may be utilized as a "shoot" button, which will be detected by mobile device 1001. A pattern of magnetic impulses may represent different types of user actions that could be differentiated and recognized by mobile device 1001.

An electromagnet is able to generate specific magnetic field behavior patterns, such as just representing a magnetic impulse or others. The impulses' shape could be used to detect more specific "events", or even allows the app to differentiate two or more objects from each other by sending a specific (unique) magnetic field shape identifiable by the mobile device sensor. The primary and most easily detectable value ruling the change is given with the N-S swap's length in term of time.

Since the magnetic field sensor always and only receives the "total" magnetic field of the space, i.e. the "sum" of all magnetic sources, there are limitations given in differentiating more than 1 toy or tool when working with permanent magnets not performing specific (unique) field changes/variations.

A possible and working scenario is given with adding a uniquely shaped magnetic field impulse to a permanent magnet that can be detected significantly by algorithms constantly analyzing the sensor's data. For example, a "shoot" button could be realized that way. An electrical magnet achieves more significant and unique signals since it can easily perform a complete North-South swap.

If different kinds of impulses need to be differentiated it becomes trickier, but this is also possible. Definitely in case only 2 impulse types have to be differentiated for 1 given object (toy, tool or figure), then the North and South poles are just exchanged by swapping the electricity source's poles.

The idea of providing the opportunity to give an impulse could also be done indirectly: the user applies an electrical button that sends any "regular" signal to a separate device, the "magnet impulse provider", that is standing anywhere in the game's scene. This button is like a remote control with maybe 1 button, or a few buttons to provide some selection options. The signal transfer is "regular" since it's infrared, Bluetooth, etc. The actual magnetic effect is performed by the dedicated "magnet impulse provider" unit, it's a separate device. There could be even several ones becoming placed at different positions, and the magnetic field change's strength could also vary to indicate something different.

In case no electricity is available, it's also possible to create a special, pure mechanical button to create a rotating and thus changing magnetic field. For example, pushing down a special button lets the button-internal magnet rotate by 180 degree resulting in a North-South exchange. The principal mechanic would be like in the traditional stamps: if a user pushes the stamp's knop down, the actually printing surface shows up by turning the plate by 180 degree. This mechanical concept, in small, could be used for the magnet N-S swap. This button can be very small and handy. Major effect is turning around and swapping the North and South poles. The button's return into the initial position is easily (forceless) possible if there is another magnet pulling it back.

In other variations, the magnetic button's reaction could vary in the way for how long this N-S-swap will rest. For example, if a user presses the button it keeps arrested for 1 to 2 seconds, and then returns quickly by itself (the user does not have to press for this entire time). It means the magnet's movement is not totally connected to the user finger's move ("press"), but rests for some short while longer to delay and settle the "signal" (e.g., magnet field change), and first then returns to the original position. This makes a signal more significant, lets it become longer than any sensor's "inertia", and would also allow the differentiation of several states, requests.

While further thinking on this concept, and combining it with electromagnets, the magnet could even more specific coding to the receiver by uniquely detectable coding of the magnet field's changes. An electrical "impulse provider" may be utilized that only acts for the moment an object (toy or tool) starts its movement. It means a signal is just available for a short period when/after the object starts moving, and stops completely afterwards even the toy or tool continues moving. It means it's only available for the first few seconds after object's move has started. The shape of that signal potentially let you differentiate different figures. The same could be performed for "stopping" the figure.

Figure 11:
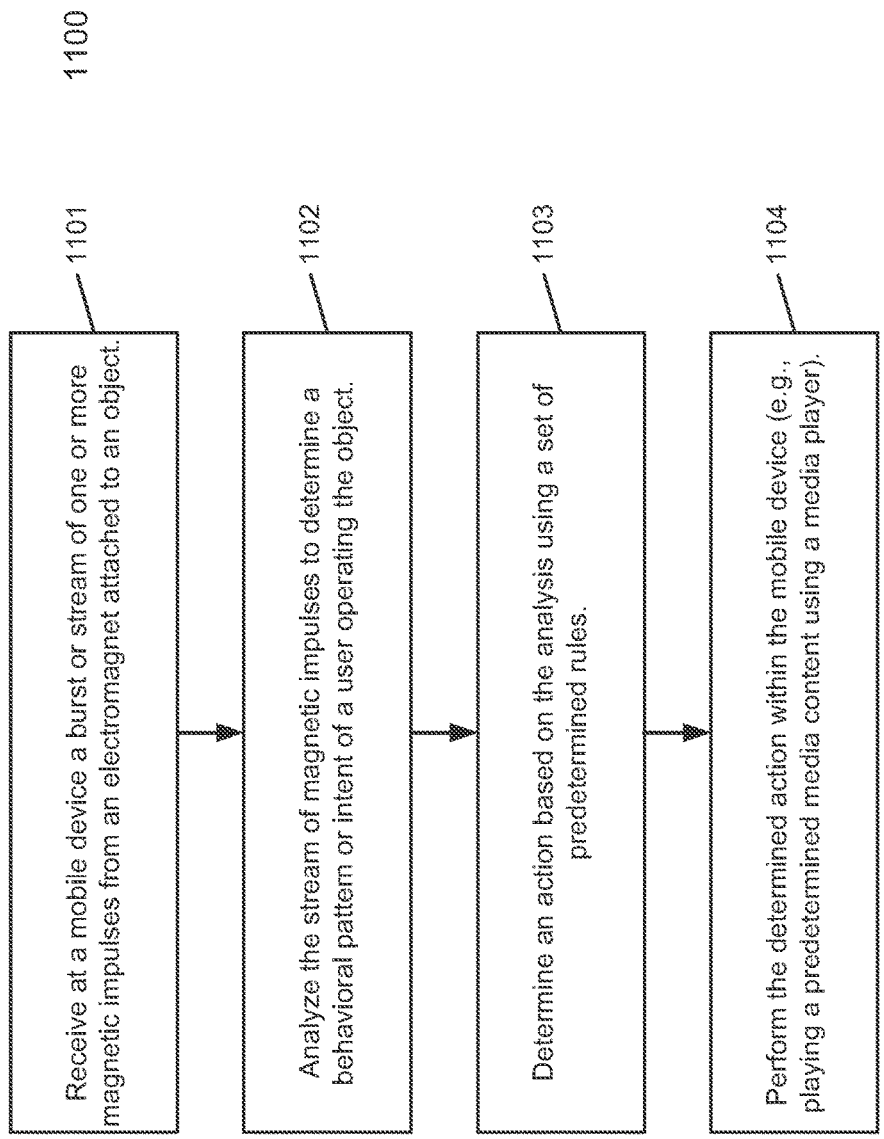
FIG. 11 is a flow diagram illustrating a process for operating a mobile device using a magnetic sensor according to another embodiment of the invention.

FIG. 11 is a flow diagram illustrating a process for operating a mobile device using a magnetic sensor according to another embodiment of the invention. Process 1100 may be performed by processing logic which may include software, hardware, or a combination thereof. For example, process 1100 may be performed by mobile device 1001 of FIG. 10. Referring to FIG. 11, at block 1101, processing logic of a mobile device receives a burst or stream of one or more magnetic impulses from an electromagnet attached to an object. At block 1102, processing logic analyzes the stream of magnetic impulses to determine a pattern of the magnetic impulses or intent of a user operating the object. At block 1103, processing logic determines an action based on the analysis using a set of predetermined rules. At block 1104, the action is performed within the mobile device, which can be playing a predetermined media content using a media player or controlling another object, etc. as described above.

Figure 12:
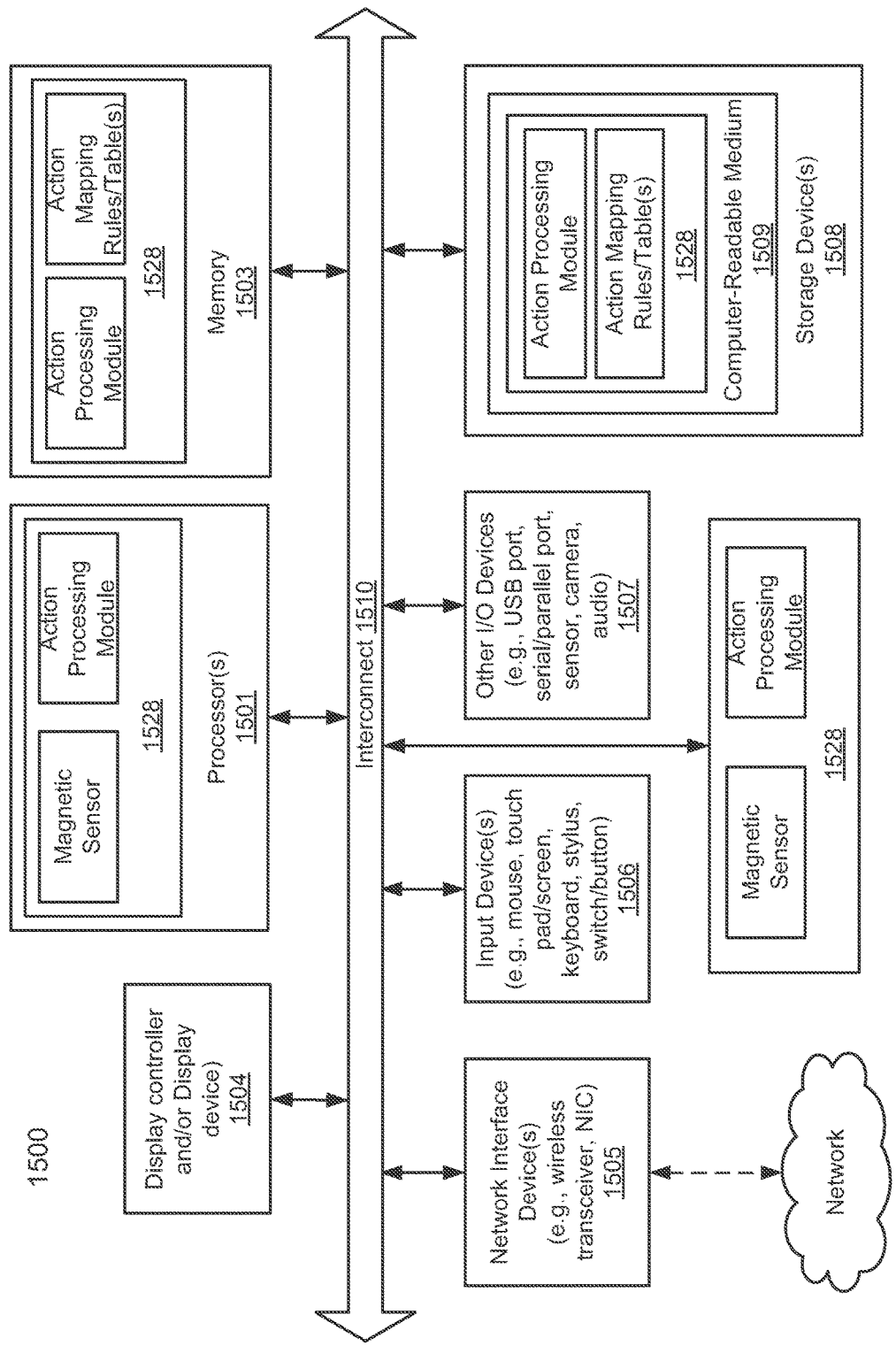
FIG. 12 is a block diagram illustrating a data processing system according to one embodiment.

FIG. 12 is a block diagram illustrating an example of a data processing system which may be used with one embodiment of the invention. For example, system 1200 may represents any of data processing systems described above performing any of the processes or methods described above, such as mobile device 101 of FIG. 1. System 1500 can include many different components. These components can be implemented as integrated circuits (ICs), portions thereof, discrete electronic devices, or other modules adapted to a circuit board such as a motherboard or add-in card of the computer system, or as components otherwise incorporated within a chassis of the computer system.

Note also that system 1500 is intended to show a high level view of many components of the computer system. However, it is to be understood that additional components may be present in certain implementations and furthermore, different arrangement of the components shown may occur in other implementations. System 1500 may represent a desktop (e.g., iMac™ available from Apple Inc.® of Cupertino, Calif.), a laptop (e.g., MacBook™), a tablet (e.g., iPad™), a server, a mobile phone (e.g., iPhone™), a media player (e.g., iPod™ or iPod Touch™), a personal digital assistant (PDA), a Smartwatch (e.g., Apple Watch™), a personal communicator, a gaming device, a network router or hub, a wireless access point (AP) or repeater, a set-top box (e.g., Apple TV™ box), or a combination thereof. Further, while only a single machine or system is illustrated, the term "machine" or "system" shall also be taken to include any collection of machines or systems that individually or jointly execute a set (or multiple sets) of instructions to perform any one or more of the methodologies discussed herein.

In one embodiment, system 1500 includes processor 1501, memory 1503, and devices 1505-1508 via a bus or an interconnect 1510. Processor 1501 may represent a single processor or multiple processors with a single processor core or multiple processor cores included therein. Processor 1501 may represent one or more general-purpose processors such as a microprocessor, a central processing unit (CPU), or the like. More particularly, processor 1501 may be a complex instruction set computing (CISC) microprocessor, reduced instruction set computing (RISC) microprocessor, very long instruction word (VLIW) microprocessor, or processor implementing other instruction sets, or processors implementing a combination of instruction sets. Processor 1501 may also be one or more special-purpose processors such as an application specific integrated circuit (ASIC), a cellular or baseband processor, a field programmable gate array (FPGA), a digital signal processor (DSP), a network processor, a graphics processor, a network processor, a communications processor, a cryptographic processor, a co-processor, an embedded processor, or any other type of logic capable of processing instructions.

Processor 1501, which may be a low power multi-core processor socket such as an ultra-low voltage processor, may act as a main processing unit and central hub for communication with the various components of the system. Such processor can be implemented as a system on chip (SoC).

Processor 1501 is configured to execute instructions for performing the operations and steps discussed herein. System 1500 may further include a graphics interface that communicates with optional graphics subsystem 1504, which may include a display controller, a graphics processor, and/or a display device.

Processor 1501 may communicate with memory 1503, which in one embodiment can be implemented via multiple memory devices to provide for a given amount of system memory. Memory 1503 may include one or more volatile storage (or memory) devices such as random access memory (RAM), dynamic RAM (DRAM), synchronous DRAM (SDRAM), static RAM (SRAM), or other types of storage devices. Memory 1503 may store information including sequences of instructions that are executed by processor 1501, or any other device. For example, executable code and/or data of a variety of operating systems, device drivers, firmware (e.g., input output basic system or BIOS), and/or applications can be loaded in memory 1503 and executed by processor 1501. An operating system can be any kind of operating systems, such as, for example, Windows® operating system from Microsoft®, Mac OS®/iOS® from Apple, Android® from Google®, Linux®, Unix®, or other real-time or embedded operating systems such as VxWorks.

System 1500 may further include IO devices such as devices 1505-1508, including network interface device(s) 1505, optional input device(s) 1506, and other optional IO device(s) 1507. Network interface device 1505 may include a wireless transceiver and/or a network interface card (NIC). The wireless transceiver may be a WiFi transceiver, an infrared transceiver, a Bluetooth transceiver, a WiMax transceiver, a wireless cellular telephony transceiver, a satellite transceiver (e.g., a global positioning system (GPS) transceiver), or other radio frequency (RF) transceivers, or a combination thereof. The NIC may be an Ethernet card.

Input device(s) 1506 may include a mouse, a touch pad, a touch sensitive screen (which may be integrated with display device 1504), a pointer device such as a stylus, and/or a keyboard (e.g., physical keyboard or a virtual keyboard displayed as part of a touch sensitive screen). For example, input device 1506 may include a touch screen controller coupled to a touch screen. The touch screen and touch screen controller can, for example, detect contact and movement or break thereof using any of a plurality of touch sensitivity technologies, including but not limited to capacitive, resistive, infrared, and surface acoustic wave technologies, as well as other proximity sensor arrays or other elements for determining one or more points of contact with the touch screen.

IO devices 1507 may include an audio device. An audio device may include a speaker and/or a microphone to facilitate voice-enabled functions, such as voice recognition, voice replication, digital recording, and/or telephony functions. Other IO devices 1507 may further include universal serial bus (USB) port(s), parallel port(s), serial port(s), a printer, a network interface, a bus bridge (e.g., a PCI-PCI bridge), sensor(s) (e.g., a motion sensor such as an accelerometer, gyroscope, a magnetometer, a light sensor, compass, a proximity sensor, etc.), or a combination thereof. Devices 1507 may further include an imaging processing subsystem (e.g., a camera), which may include an optical sensor, such as a charged coupled device (CCD) or a complementary metal-oxide semiconductor (CMOS) optical sensor, utilized to facilitate camera functions, such as recording photographs and video clips. Certain sensors may be coupled to interconnect 1510 via a sensor hub (not shown), while other devices such as a keyboard or thermal sensor may be controlled by an embedded controller (not shown), dependent upon the specific configuration or design of system 1500.

To provide for persistent storage of information such as data, applications, one or more operating systems and so forth, a mass storage (not shown) may also couple to processor 1501. In various embodiments, to enable a thinner and lighter system design as well as to improve system responsiveness, this mass storage may be implemented via a solid state device (SSD). However in other embodiments, the mass storage may primarily be implemented using a hard disk drive (HDD) with a smaller amount of SSD storage to act as a SSD cache to enable non-volatile storage of context state and other such information during power down events so that a fast power up can occur on re-initiation of system activities. Also a flash device may be coupled to processor 1501, e.g., via a serial peripheral interface (SPI). This flash device may provide for non-volatile storage of system software, including a basic input/output software (BIOS) as well as other firmware of the system.

Storage device 1508 may include computer-accessible storage medium 1509 (also known as a machine-readable storage medium or a computer-readable medium) on which is stored one or more sets of instructions or software (e.g., module, unit, and/or logic 1528) embodying any one or more of the methodologies or functions described herein. Module/unit/logic 1528 may represent any of the components described above, such as, for example, an action processing module, action mapping rules or table. Module/unit/logic 1528 may also reside, completely or at least partially, within memory 1503 and/or within processor 1501 during execution thereof by data processing system 1500, memory 1503 and processor 1501 also constituting machine-accessible storage media. Module/unit/logic 1528 may further be transmitted or received over a network via network interface device 1505.

Computer-readable storage medium 1509 may also be used to store the some software functionalities described above persistently. While computer-readable storage medium 1509 is shown in an exemplary embodiment to be a single medium, the term "computer-readable storage medium" should be taken to include a single medium or multiple media (e.g., a centralized or distributed database, and/or associated caches and servers) that store the one or more sets of instructions. The terms "computer-readable storage medium" shall also be taken to include any medium that is capable of storing or encoding a set of instructions for execution by the machine and that cause the machine to perform any one or more of the methodologies of the present invention. The term "computer-readable storage medium" shall accordingly be taken to include, but not be limited to, solid-state memories, and optical and magnetic media, or any other non-transitory machine-readable medium.

Module/unit/logic 1528, components and other features described herein can be implemented as discrete hardware components or integrated in the functionality of hardware components such as ASICS, FPGAs, DSPs or similar devices. In addition, module/unit/logic 1528 can be implemented as firmware or functional circuitry within hardware devices. Further, module/unit/logic 1528 can be implemented in any combination hardware devices and software components.

Note that while system 1500 is illustrated with various components of a data processing system, it is not intended to represent any particular architecture or manner of interconnecting the components; as such details are not germane to embodiments of the present invention. It will also be appreciated that network computers, handheld computers, mobile phones, servers, and/or other data processing systems which have fewer components or perhaps more components may also be used with embodiments of the invention.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities.

It should be borne in mind, however, that all of these and similar terms are to be associated with the appropriate physical quantities and are merely convenient labels applied to these quantities. Unless specifically stated otherwise as apparent from the above discussion, it is appreciated that throughout the description, discussions utilizing terms such as those set forth in the claims below, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

The techniques shown in the figures can be implemented using code and data stored and executed on one or more electronic devices. Such electronic devices store and communicate (internally and/or with other electronic devices over a network) code and data using computer-readable media, such as non-transitory computer-readable storage media (e.g., magnetic disks; optical disks; random access memory; read only memory; flash memory devices; phase-change memory) and transitory computer-readable transmission media (e.g., electrical, optical, acoustical or other form of propagated signals—such as carrier waves, infrared signals, digital signals).

The processes or methods depicted in the preceding figures may be performed by processing logic that comprises hardware (e.g. circuitry, dedicated logic, etc.), firmware, software (e.g., embodied on a non-transitory computer readable medium), or a combination of both. Although the processes or methods are described above in terms of some sequential operations, it should be appreciated that some of the operations described may be performed in a different order. Moreover, some operations may be performed in parallel rather than sequentially.

In the foregoing specification, embodiments of the invention have been described with reference to specific exemplary embodiments thereof. It will be evident that various modifications may be made thereto without departing from the broader spirit and scope of the invention as set forth in the following claims. The specification and drawings are, accordingly, to be regarded in an illustrative sense rather than a restrictive sense.

What is claimed is:

1. A computer-implemented method for operating a mobile device using a magnetic sensor, the method comprising:
   detecting, by a magnetic sensor attached to a mobile device, a magnetic field generated from a magnet attached to an object;
   generating, by a magnetic sensor data processing module, magnetic sensor data based on the magnetic field, the magnetic sensor data representing a current position of the magnet of the object;
   processing, by an action processing module, the magnetic sensor data to determine a movement of the object with respect to the mobile device, while the mobile device remains in a relatively steady location;
   identifying, by the action processing module, a predetermined action based on the movement of the object, including performing a lookup operation in an action mapping table based on the movement of the object to determine the predetermined action, wherein the action mapping table comprises a plurality of action entries, each action entry mapping a movement of the object to one of a plurality of predetermined actions; and
   performing the predetermined action within the mobile device.

2. The method of claim 1, wherein performing the predetermined action comprises playing a media content associated with the predetermined action using a media player associated with the mobile device.

3. The method of claim 1, wherein the movement of the magnet comprises a change of at least one of a direction of the magnet or a strength of the magnetic field of the magnet.

4. A computer-implemented method for operating a mobile device using a magnetic sensor, the method comprising:
   detecting, by a magnetic sensor attached to a mobile device, a magnetic field generated from a magnet attached to an object,
   generating, by a magnetic sensor data processing module, magnetic sensor data based on the magnetic field, the magnetic sensor data representing a current position of the magnet of the object;
   processing, by an action processing module, the magnetic sensor data to determine a movement of the object with respect to the mobile device, while the mobile device remains in a relatively steady location;
   identifying, by the action processing module, a predetermined action based on the movement of the object, including
      determining the current position of the magnet of the object based on the magnetic sensor data in view of a previous position of the magnet of the object, and
      determining the predetermined action based on a difference between the current position and the previous position of the magnet of the object; and
   performing the predetermined action within the mobile device.

5. The method of claim 4, further comprising:
   determining a direction of the movement of the magnet of the object based on the magnetic sensor data;
   determining whether the direction is expected from the previous position of the magnet of the object; and
   indicating that the direction is incorrect in response to determining that the direction is unexpected.

6. The method of claim 5, wherein indicating that the direction is incorrect comprises playing a predetermined media content via the media player of the mobile device.

7. The method of claim 4, further comprising:
   determining whether the object with the magnet should move given the previous position of the magnet; and
   instructing a user associated with the object not to move in response to determining that the object with the magnet should not move.

8. The method of claim 4, further comprising:
determining an angle between the current position and the previous position of the magnet attached to the object with respect to the mobile device based on the magnetic sensor data;
transmitting a command to a controller to rotate a second object according to the angle, such that a predetermined surface of the second objects follows the movement of the object.

9. The method of claim 8, wherein the second object is a supporting platform, wherein the mobile device is placed on the supporting platform, and wherein the controller causes the supporting platform to rotate by the angle, such that a display screen associated with the mobile device faces the object at the current position.

10. A computer-implemented method for operating a mobile device using a magnetic sensor, the method comprising:
detecting, by a magnetic sensor attached to a mobile device, a magnetic field generated from a magnet attached to an object,
generating, by a magnetic sensor data processing module, magnetic sensor data based on the magnetic field, the magnetic sensor data representing a current position of the magnet of the object;
processing, by an action processing module, the magnetic sensor data to determine a movement of the object with respect to the mobile device, while the mobile device remains in a relatively steady location, including
receiving magnetic sensor data from one or more remote devices wirelessly, wherein each of the remote devices includes a magnetic sensor to sense the magnetic field from the magnet and to generate the magnetic sensor data, and
incorporating the magnetic sensor data from the remote devices with the magnetic sensor data generated locally to determine the movement of the magnet of the object;
identifying, by the action processing module, a predetermined action based on the movement of the object; and
performing the predetermined action within the mobile device.

11. The method of claim 10, further comprising:
determining whether a second mobile device of the remote devices is a master device based on a strength of the magnetic field detected by the magnetic sensor; and
sending the magnetic sensor data to the second mobile device wirelessly to allow the second mobile device to determine the movement of the object.

12. A computer-implemented method for operating a mobile device using a magnetic sensor, the method comprising:
detecting, by a magnetic sensor attached to a mobile device, a magnetic field generated from a magnet attached to an object;
generating, by a magnetic sensor data processing module, magnetic sensor data based on the magnetic field, the magnetic sensor data representing a current position of the magnet of the object;
processing, by an action processing module, the magnetic sensor data to determine a movement of the object with respect to the mobile device, while the mobile device remains in a relative steady location;
identifying, by the action processing module, a predetermined action based on the movement of the object, including
detecting the magnetic field in a stream of magnetic impulses generated from the magnet of the object, wherein the magnet attached to the object is an electromagnet,
determining a pattern of the stream of magnetic impulses, and
determining the predetermined action based on the pattern of the stream of magnetic impulses; and
performing the predetermined action within the mobile device.

13. A non-transitory computer-readable storage medium having instructions stored therein, which when executed by a computer, cause the computer to perform operations of operating a mobile device using a magnetic sensor, the operations comprising:
detecting a magnetic field generated from a magnet attached to an object;
generating magnetic sensor data based on the magnetic field, the magnetic sensor data representing a current position of the magnet of the object;
processing the magnetic sensor data to determine a movement of the object with respect to the mobile device, while the mobile device remains in a relatively steady location;
identifying a predetermined action based on the movement of the object, including performing a lookup operation in an action mapping table based on the movement of the object to determine the predetermined action, wherein the action mapping table comprises a plurality of action entries, each action entry mapping a movement of the object to one of a plurality of predetermined actions; and
performing the predetermined action within the mobile device.

14. A mobile device, comprising:
a processor;
a magnetic sensor coupled to the processor to detect a magnetic field generated from a magnet attached to an object;
a magnetic sensor data processing module to generate magnetic sensor data based on the magnetic field, the magnetic sensor data representing a current position of the magnet of the object; and
an action processing module to
process the magnetic sensor data to determine a movement of the object with respect to the mobile device, while the mobile device remains in a relatively steady location,
identify a predetermined action based on the movement of the object, including performing a lookup operation in an action mapping table based on the movement of the object to determine the predetermined action, wherein the action mapping table comprises a plurality of action entries, each action entry mapping a movement of the object to one of a plurality of predetermined actions, and
cause the predetermined action to be performed within the mobile device.

15. The non-transitory computer-readable storage medium of claim 13, wherein performing the predetermined action comprises playing a media content associated with the predetermined action using a media player associated with the mobile device.

16. The non-transitory computer-readable storage medium of claim 13, wherein the movement of the magnet comprises a change of at least one of a direction of the magnet or a strength of the magnetic field of the magnet.

17. The non-transitory computer-readable storage medium of claim 13, wherein the movement of the magnet comprises a change of at least one of a direction of the magnet or a strength of the magnetic field of the magnet.

18. The system of claim 14, wherein performing the predetermined action comprises playing a media content associated with the predetermined action using a media player associated with the mobile device.

19. The system of claim 14, wherein the movement of the magnet comprises a change of at least one of a direction of the magnet or a strength of the magnetic field of the magnet.

20. The system of claim 14, wherein the movement of the magnet comprises a change of at least one of a direction of the magnet or a strength of the magnetic field of the magnet.

* * * * *